(12) United States Patent
Rajala et al.

(10) Patent No.: US 8,115,621 B2
(45) Date of Patent: Feb. 14, 2012

(54) DEVICE FOR TRACKING THE MOVEMENT OF INDIVIDUALS OR OBJECTS

(76) Inventors: Yoganand Rajala, Suwanee, GA (US); Steve Aninye, Alpharetta, GA (US)

( * ) Notice: Subject to any disclaimer, the term of this patent is extended or adjusted under 35 U.S.C. 154(b) by 86 days.

(21) Appl. No.: 12/112,695

(22) Filed: Apr. 30, 2008
(Under 37 CFR 1.47)

(65) Prior Publication Data
US 2009/0109633 A1    Apr. 30, 2009

Related U.S. Application Data (60) Provisional application No. 60/915,235, filed on May 1, 2007.

(51) Int. Cl.
*G08B 1/08* (2006.01)
(52) U.S. Cl. ............ 340/539.13; 340/539.11; 340/573.4; 340/693.5
(58) Field of Classification Search ............... 340/572.8, 340/539.1, 539.11, 539.13, 539.23, 573.1, 340/573.4, 825.49, 693.5, 539.12, 573.3, 340/572.1, 539.31; 455/456, 457, 456.1; 200/DIG. 2
See application file for complete search history.

(56) References Cited

U.S. PATENT DOCUMENTS

| | | | |
|---|---|---|---|
| 4,359,733 A | 11/1982 | O'Neill | |
| 4,673,936 A | 6/1987 | Kotoh | |
| 4,736,196 A | 4/1988 | McMahon | |
| 4,747,120 A | 5/1988 | Foley | |
| 4,750,197 A | 6/1988 | Denekamp et al. | |
| 4,777,477 A | 10/1988 | Watson | |
| 4,812,823 A | 3/1989 | Dickerson | |
| 4,885,571 A * | 12/1989 | Pauley et al. | 340/573.4 |
| 4,918,425 A | 4/1990 | Greenberg et al. | |
| 4,918,432 A | 4/1990 | Pauley et al. | |
| 4,952,928 A | 8/1990 | Carroll | |
| 4,999,613 A | 3/1991 | Williamson | |
| 5,043,736 A | 8/1991 | Darnell | |
| 5,182,543 A | 1/1993 | Siegel | |
| 5,204,670 A | 4/1993 | Stinton | |
| 5,298,884 A | 3/1994 | Gilmore | |
| 5,365,516 A | 11/1994 | Jandrell | |
| 5,461,365 A | 10/1995 | Schlager et al. | |
| 5,461,390 A | 10/1995 | Hoshen | |
| 5,468,110 A | 11/1995 | McDonald et al. | |
| 5,471,197 A | 11/1995 | McCurdy et al. | |
| 5,493,694 A | 2/1996 | Vlcek | |
| 5,497,148 A | 3/1996 | Oliva | |

(Continued)

FOREIGN PATENT DOCUMENTS

DE    19832671    1/2000

(Continued)

OTHER PUBLICATIONS

Office Action issued in U.S. Appl. No. 10/591,830, mailed Dec. 26, 2008.

(Continued)

*Primary Examiner* — Anh V La
(74) *Attorney, Agent, or Firm* — DLA Piper LLP US (57) ABSTRACT

A tracking device for tracking an individual or object includes a housing configured to house components for tracking an individual or object. The housing has a first part and a second part. The first and second parts are configured to be joined together to form a waterproof housing.

34 Claims, 8 Drawing Sheets

U.S. PATENT DOCUMENTS

| | | |
|---|---|---|
| 5,497,149 A | 3/1996 | Fast |
| 5,504,474 A | 4/1996 | Libman |
| 5,518,402 A | 5/1996 | Tommarello |
| 5,523,740 A | 6/1996 | Burgmann |
| 5,537,102 A | 7/1996 | Pinnow |
| 5,552,772 A | 9/1996 | Janky et al. |
| 5,559,520 A | 9/1996 | Barzegar |
| 5,568,119 A | 10/1996 | Schipper et al. |
| 5,593,267 A | 1/1997 | McDonald et al. |
| 5,594,425 A | 1/1997 | Ladner |
| 5,623,390 A * | 4/1997 | Noda et al. ............. 361/679.02 |
| 5,627,520 A | 5/1997 | Grubbs |
| 5,646,632 A | 7/1997 | Khan |
| 5,650,766 A * | 7/1997 | Burgmann ............. 340/539.11 |
| 5,650,770 A | 7/1997 | Schlager et al. |
| 5,652,570 A | 7/1997 | Lepkofkor |
| 5,712,619 A | 1/1998 | Simkin |
| 5,714,931 A | 2/1998 | Petite et al. |
| 5,731,757 A | 3/1998 | Layson |
| 5,742,233 A | 4/1998 | Hoffman et al. |
| 5,742,509 A | 4/1998 | Goldberg et al. |
| 5,748,148 A | 5/1998 | Heiser |
| 5,752,976 A | 5/1998 | Duffin |
| 5,825,283 A | 10/1998 | Camhi |
| 5,828,987 A | 10/1998 | Tano et al. |
| 5,835,377 A | 11/1998 | Bush |
| 5,835,907 A | 11/1998 | Newman |
| 5,838,237 A | 11/1998 | Revell et al. |
| 5,852,401 A | 12/1998 | Kita |
| 5,857,433 A | 1/1999 | Files |
| 5,867,103 A | 2/1999 | Taylor |
| 5,870,029 A | 2/1999 | Otto et al. |
| 5,890,061 A | 3/1999 | Timm |
| 5,892,454 A | 4/1999 | Schipper et al. |
| D410,206 S | 5/1999 | Slater |
| 5,905,461 A | 5/1999 | Neher |
| 5,940,004 A | 8/1999 | Fulton |
| 5,948,038 A | 9/1999 | Daley et al. |
| 5,959,533 A | 9/1999 | Layson, Jr. |
| 5,982,281 A | 11/1999 | Layson, Jr. |
| 5,990,793 A | 11/1999 | Bieback |
| 6,011,510 A | 1/2000 | Yee |
| 6,014,080 A | 1/2000 | Layson, Jr. |
| 6,024,928 A | 2/2000 | Foster |
| 6,054,928 A | 4/2000 | Lemelson et al. |
| D424,463 S | 5/2000 | Babers, Jr. |
| 6,072,396 A | 6/2000 | Gaukel |
| 6,084,517 A | 7/2000 | Rabanne |
| 6,100,806 A | 8/2000 | Gaukel |
| 6,104,295 A | 8/2000 | Tenarvitz et al. |
| 6,131,067 A | 10/2000 | Gired et al. |
| 6,160,481 A | 12/2000 | Taylor, Jr. |
| 6,181,253 B1 | 1/2001 | Eschenbach et al. |
| 6,198,431 B1 | 3/2001 | Gibson |
| D440,170 S | 4/2001 | Conerly |
| 6,218,945 B1 | 4/2001 | Taylor, Jr. |
| 6,232,880 B1 | 5/2001 | Anderson et al. |
| 6,232,916 B1 | 5/2001 | Grillo |
| 6,239,700 B1 | 5/2001 | Hoffman et al. |
| 6,278,370 B1 | 8/2001 | Underwood |
| 6,344,794 B1 | 2/2002 | Ulrich et al. |
| 6,356,841 B1 | 3/2002 | Hamrick et al. |
| 6,392,565 B1 | 5/2002 | Brown |
| 6,405,213 B1 | 6/2002 | Layson, Jr. |
| 6,430,813 B2 * | 8/2002 | Muraguchi et al. .......... 30/43.92 |
| 6,431,455 B1 | 8/2002 | Ponert |
| 6,438,380 B1 | 8/2002 | Bi |
| 6,512,456 B1 | 1/2003 | Taylor, Jr. |
| 6,606,556 B2 | 8/2003 | Curatolo et al. |
| 6,624,750 B1 | 9/2003 | Marman et al. |
| 6,639,516 B1 | 10/2003 | Copley |
| 6,646,617 B1 | 11/2003 | Gaukel |
| 6,703,936 B2 | 3/2004 | Hill et al. |
| 6,711,500 B2 | 3/2004 | Cheng |
| 6,747,555 B2 | 6/2004 | Fellenstein et al. |
| 6,774,797 B2 | 8/2004 | Freathy et al. |
| 6,774,799 B2 | 8/2004 | Defant |
| 6,801,853 B2 | 10/2004 | Workman |
| 6,838,998 B1 | 1/2005 | Brown |
| 6,840,904 B2 | 1/2005 | Goldberg |
| 6,862,454 B1 | 3/2005 | Kanevsky |
| RE38,838 E | 10/2005 | Taylor |
| 6,961,592 B2 * | 11/2005 | O'Connor ..................... 455/572 |
| 6,972,684 B2 | 12/2005 | Copley |
| 6,975,222 B2 | 12/2005 | Krishan |
| 6,975,234 B2 | 12/2005 | Boccacci |
| 6,992,582 B2 * | 1/2006 | Hill et al. ................. 340/539.13 |
| 7,015,817 B2 | 3/2006 | Copley et al. |
| 7,034,678 B2 | 4/2006 | Burkley et al. |
| 7,034,695 B2 | 4/2006 | Troxler |
| D520,393 S | 5/2006 | Darby |
| 7,038,590 B2 | 5/2006 | Hoffman et al. |
| 7,064,670 B2 | 6/2006 | Galperin |
| 7,079,034 B2 | 7/2006 | Stilp |
| 7,098,795 B2 | 8/2006 | Adamczyk et al. |
| 7,119,695 B2 | 10/2006 | Defant |
| D534,822 S | 1/2007 | Wadda |
| D535,205 S | 1/2007 | Frederick et al. |
| 7,209,757 B2 | 4/2007 | Naghian et al. |
| 7,283,044 B2 | 10/2007 | Bandy |
| 7,289,786 B2 | 10/2007 | Krasner |
| RE39,909 E | 11/2007 | Taylor, Jr. |
| 7,299,987 B2 | 11/2007 | Yoo et al. |
| 7,382,268 B2 | 6/2008 | Hartman |
| 7,492,254 B2 | 2/2009 | Bandy et al. |
| 7,518,514 B2 | 4/2009 | Bauchot et al. |
| 7,598,855 B2 | 10/2009 | Scalisi et al. |
| 7,728,724 B1 | 6/2010 | Scalisi et al. |
| 7,877,104 B2 | 1/2011 | Turetzky |
| 2001/0048364 A1 | 12/2001 | Kalthoff et al. |
| 2003/0030561 A1 | 2/2003 | Yafuso |
| 2003/0034894 A1 | 2/2003 | Montagnino |
| 2003/0112141 A1 | 6/2003 | Arunkumar |
| 2003/0210142 A1 | 11/2003 | Freathy et al. |
| 2003/0227382 A1 | 12/2003 | Breed |
| 2006/0109110 A1 | 5/2006 | Hill |
| 2007/0276270 A1 | 11/2007 | Tran |
| 2008/0001764 A1 | 1/2008 | Douglas et al. |
| 2008/0055109 A1 | 3/2008 | Freathy |
| 2008/0108370 A1 | 5/2008 | Aninye |

FOREIGN PATENT DOCUMENTS

| | | |
|---|---|---|
| EP | 0528090 | 2/1993 |
| EP | 0745867 | 12/1995 |
| EP | 1363258 | 11/2003 |
| GB | 2279170 | 12/1994 |
| GB | 2383666 | 7/2003 |
| WO | WO 88/09541 | 12/1988 |

OTHER PUBLICATIONS

U.S. Appl. No. 90/010,372, filed Dec. 26, 2008, Taylor.

Murphy, John. "Advanced Electronic Monitoring for Tracking Persons on Probation or Parole," Feb. 29, 1996, pp. 1-34 and Appendix A.

Hoshen, Joseph. "Keeping Tabs on Criminals," IEEE Spectrum, Feb. 1995, pp. 26-31.

Whitfield, Dick. "Tackling the Tag," Chapter 9, 1997, pp. 109-119.

Pro Tech Monitoring, Inc., SMART Systems Briefing, circa 1995-1996.

EBSCO Host, "Spy' in the Sky," Onternational Construction, Aug. 1997, vol. 36, Issue 8.

Gable, Ralph. "Application of Personal Telemonitoring to Current Problems in Corrections." Journal of Criminal Justice. vol. 14, pp. 167-176 (1986).

Holland, James. Political Implications of Applying Behavioral Pschology, Mexico City, 1972.

Mainprize, Steve. "Elective Affinities in the Engineering of Social Control: The Evolution of Electronic Monitoring," ISSN: 1195 3655, Electronic Journal of Sociology (1996).

Le Marshall, Chris. "Single Geostatic Orbital Satellite in Tracking Ground-Based Mobile Radio Transmitter," National Air Intelligence Center, Oct. 11, 1995.

Montes, Marisela. "Technological Advances in Parole Supervision," Corrections Today, vol. 58, Issue 4, Jul. 1996.

Nieto, Marcus. "Community Correction Punishments.: An Alternative to Incarceration for Nonviolent Offenders," May 1996.
Schwitzgebel, Robert. "Psychotechnology Electronic Control of Mind and Behavior," Chapter 4, New York, 1973.
Reexamination Control U.S. Appl. No. 90/010,372, filed Dec. 26, 2008.
Wade, Andy. Book Review: *Tracking the Tag: The Electronic Monitoring of Offenders*, by Dick Whitfield, Probation Journal; 1997; 44; 234.
Harris County Invitation to Bid, Lease of Electronic Monitoring Equipment for the Harris County Community Supervision and Correction Department; circa 1994.
Electronic Monitoring: A listing of materials availaible at the Justice Institute Library, Oct. 6, 2006.
File history of U.S. Patent 6,100,806.
"Current Electronic Monitoring Market Place", circa 1995-1996.
U.S. Appl. No. 11/806,841, filed Jun. 4, 2007, Taylor, Jr.
Search Report issued in PCT/US2006/017541.
International Preliminary Report of Patentability issued in PCT/US06/017541.
Search Report issued in PCT/US2006/017678.
International Preliminary Report of Patentability issued in PCT/US06/017678.
Notice of Allowance issued in U.S. Appl. No. 29/279,448 mailed Jun. 27, 2008.
Notice of Allowance issued in U.S. Appl. No. 11/935,833 mailed Oct. 8, 2008.
Extended European Search Report issued in EP Appl 06759293.1 on Oct. 23, 2009.
Extended European Search Report issued in EP Appl 06740595.1 on Oct. 5, 2009.
European Search Report issued in EP Appl 10150064.3 on Mar. 12, 2010.
English Abstract of DE 19832671 published Jan. 27, 2000.
File History of U.S. Appl. No. 10/591,830.
File History of U.S. Appl. No. 11/935,833.
File History of U.S. Appl. No. 29/279,448.
File History of U.S. Appl. No. 12/350,678.
File History of U.S. Appl. No. 12/794,500.
Notice of Allowance issued in EP Appl 06759293.1 on Dec. 7, 2010.
File History of U.S. Appl. No. 11/935,858.
File History of U.S. Appl. No. 12/639,524.

* cited by examiner

DEVICE FOR TRACKING THE MOVEMENT OF INDIVIDUALS OR OBJECTS

CROSS-REFERENCE TO RELATED APPLICATIONS

The present patent application claims priority to U.S. provisional patent application Ser. No. 60/915,235, filed on May 1, 2007 which is related to U.S. provisional patent application Ser. No. 60/678,823, filed on May 6, 2005, related to PCT Application No. US06/12754, filed on Apr. 6, 2006, and related to PCT Application No. US06/017678, filed on May 8, 2006, all of which are incorporated herein by reference.

FIELD OF INVENTION

The present invention relates generally to position determining devices and more particularly to a waterproof tracking device for tracking the movement of an individual or object.

DETAILED DESCRIPTION OF EMBODIMENTS OF THE INVENTION

Although the tracking device will be described in the following paragraphs as being used for monitoring the movement of an individual, it must be appreciated that the tracking device can be used without a strap for tracking an object by imbedding or otherwise attaching or disposing the tracking device in or on the object. The object can be, for example, a shipping container, a money bag, or any other object that requires tracking.

Figure 1:
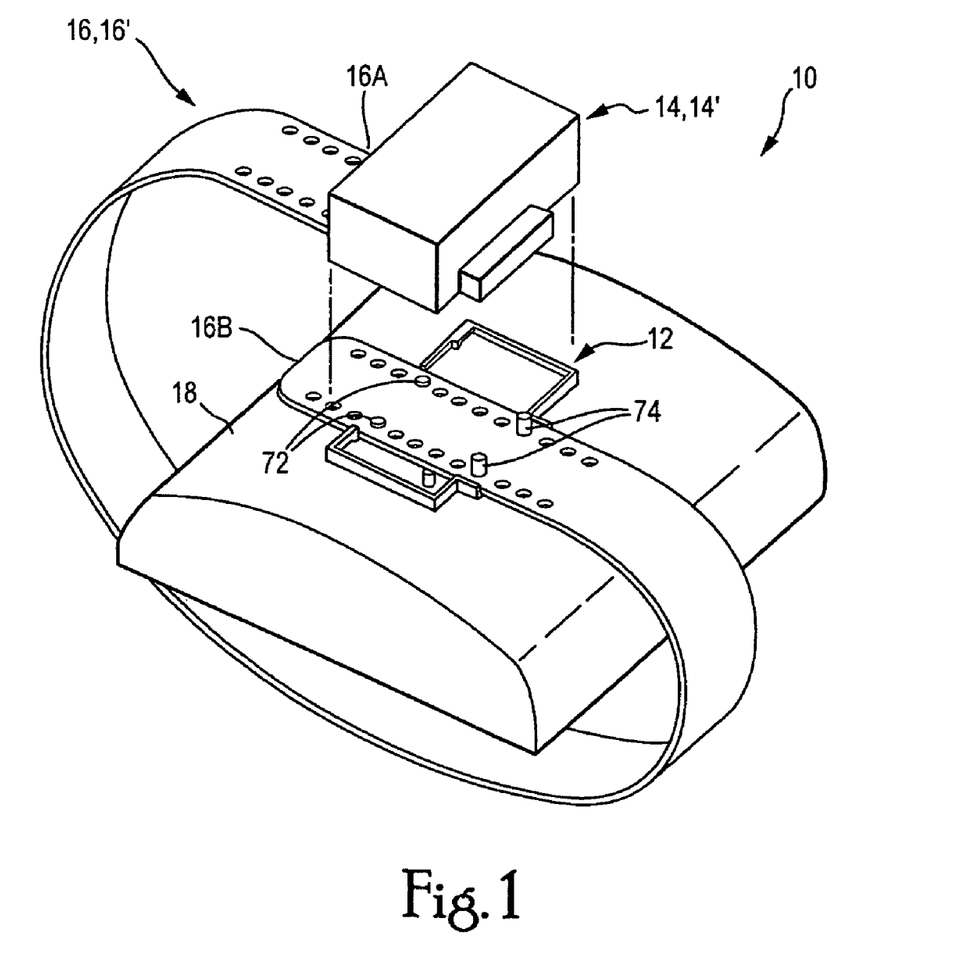
FIG. 1 is a perspective view of a tracking device for tracking the movement of an individual, according to an embodiment of the present invention.

FIG. 1 shows a tracking device for monitoring the movement of an individual, according to an embodiment of the present invention. The tracking device 10 comprises a lock bracket 12, a main housing 14, 14' for housing various components including a battery, electronic circuitry (e.g., a transceiver, GPS locating circuitry, etc.), optical devices (e.g., a light source, a light receiver, etc.) and optical connectors (not shown in FIG. 1), and a strap 16, 16'. As will be explained in great detail below, strap 16 is employed with housing 14 and strap 16' is employed with housing 14'. A padding 18 can, optionally, be provided on the back of the lock bracket 12 so that the tracking device 10 can be, for example, worn comfortably around a leg or an arm of an individual. Alternatively, the padding 18 can be omitted. The individual can be, for example, an offender who is subject to a restraining order or house arrest from a court, or the like. One end 16A of the strap 16, 16' is attached to the housing 14, 14'. The strap is then wrapped around the individual's leg or arm and the other end 16B of strap 16, 16' is then attached to the lock bracket 12 using pins 72 and 74 (shown also in FIG. 6). The main housing 14, 14' is then brought against the lock bracket 12 so as to lock the strap 16, 16' between the housing 14, 14' and the lock bracket 12.

Figure 7A:
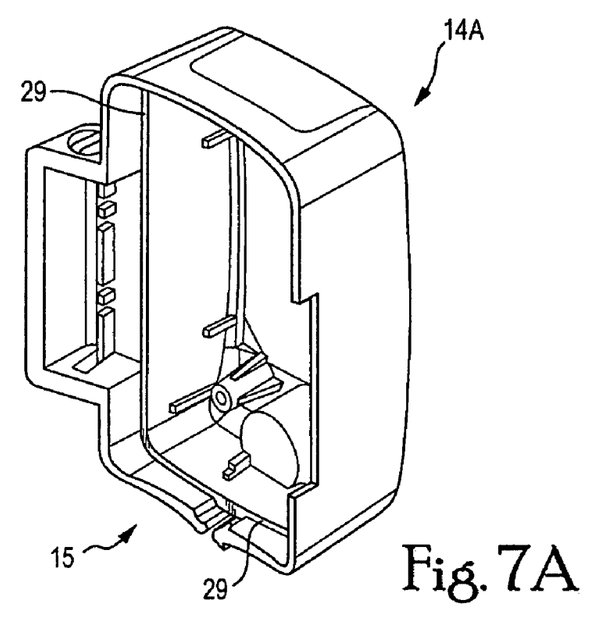
FIGS. 7A and 7B are perspective views of two conjoining parts of a housing of a waterproof tracking device, according to an embodiment of the present invention.
Figure 7B:
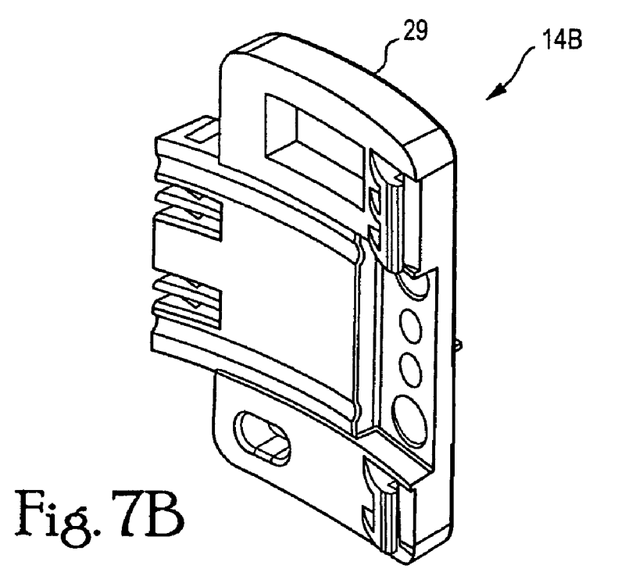

As depicted in FIGS. 7A and 7B, the main housing 14' comprises two parts. A first front housing part 14A and a second plate-like part 14B. The plate-like part 14B is adapted to close an opening 15 in the front housing part 14A so as to seal the front housing part 14A. The plate-like part 14B is also adapted to attach to the lock bracket 12 to lock the strap 16'. The two parts 14A and 14B are joined together along a seam 29 at the periphery of the two parts 14A and 14B. The two parts 14A and 14B are joined together to create a waterproof housing cavity or enclosure so as to isolate the components inside the housing 14' from environmental elements, including exposure to water, humidity in the atmosphere, etc. A waterproof enclosure is defined as an enclosure capable of withstanding water seepage at a depth in water of up to 66 feet (approximately 20 meters) for up to 8 hours. In one embodiment, the two parts are joined, for example, welded using an ultrasonic welding procedure. However, any other suitable joining method for creating a waterproof enclosure can be used. For example, the two parts 14A and 14B can be joined together using any suitable adhesive, such as a radiation curing adhesive (e.g., UV curing adhesive).

Figure 2A:
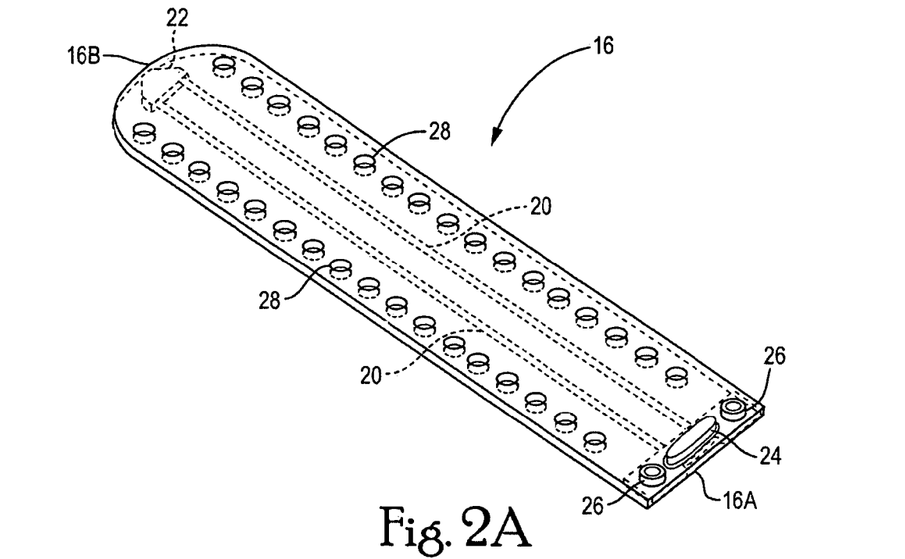
FIG. 2A is a perspective view of a tamper resistant strap for use with a tracking device, according to an embodiment of the present invention.

FIG. 2A shows the strap 16 (optionally reusable), according to an embodiment of the present invention. The strap 16 has optical cable or optical fiber 20 and light guide 22. The strap 16 can be manufactured from a plastic molded over optical cable 20 and light guide 22. The strap 16 may also have a light guide connector 24, apertures 26 to accept fasteners, and apertures 28 to receive locking pins (e.g., locking pins 72, 74 shown in FIG. 6). The optical cable can be configured to guide light from one end 16A of the strap 16 to an opposite end 16B of the strap 16 and back to the end 16A. The light guide connector 24 disposed on one end 16A of the strap 16 is configured to direct light through a first length of the optical cable 20 to the light guide 22 disposed on the opposite end 16B of the strap. The light guide 22 is configured to redirect the light back through a second length of the optical cable 20 to the end 16A of the strap.

Figure 2B:
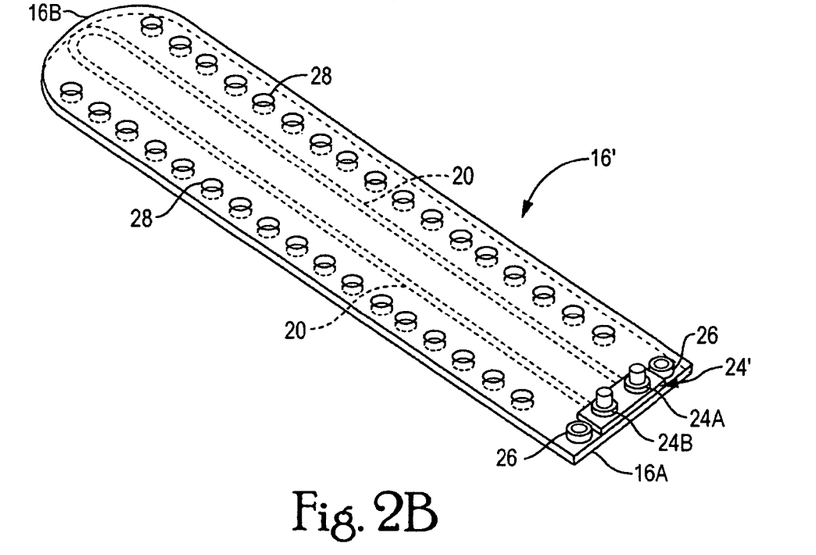
FIG. 2B is a perspective view of a tamper resistant strap for use with a tracking device, according to another embodiment of the present invention.

FIG. 2B shows the strap (reusable strap) 16', according to another embodiment of the present invention. The strap 16' has optical cable or optical fiber 20. The strap 16' can be manufactured from a plastic molded over optical cable 20. The strap 16' may also have a light guide connector 24' which includes light transmitting connector 24A and light receiving connector 24B, apertures 26 to accept fasteners, and apertures 28 to receive locking pins (e.g., locking pins 72, 74 shown in FIG. 6). The optical cable 20 guides light from optoelectronics components optically coupled to the reusable strap via the light transmitting connector 24A from one end 16A of the strap 16' to an opposite end 16B of the strap 16' and back to the end 16A, to interface back with the optoelectronics components via the light receiving connector 24B.

An alternative strap design may include a flexible battery within the strap. An exemplary battery technology that may be employed in such a strap is a thin flexible battery using organic radial battery technology or other battery technologies. Significant power resources for the device 10 can be located within the strap 16, 16'. In which case, the main housing 14, 14' may no longer contain the entire power supply, and by utilizing a smaller battery within the housing, the size of the housing 14, 14' may be reduced, resulting in a device that is more compact and thus more easily worn.

Figure 3:
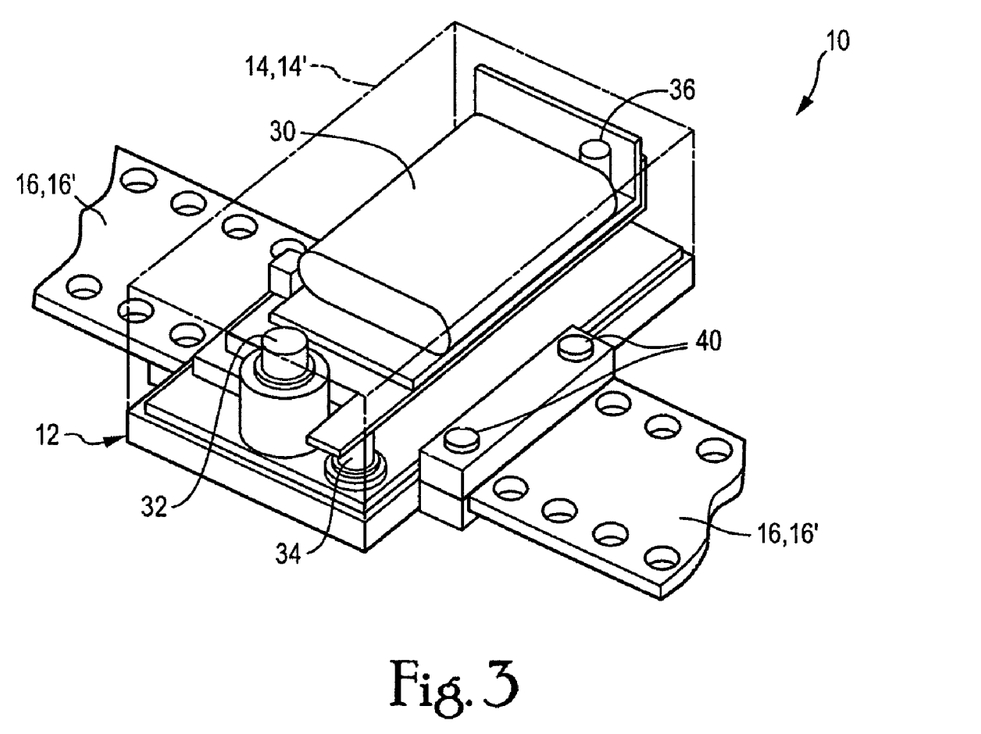
FIG. 3 is a see-through perspective view of a housing of the tracking device shown in FIG. 1, according to an embodiment of the present invention.
Figure 4A:
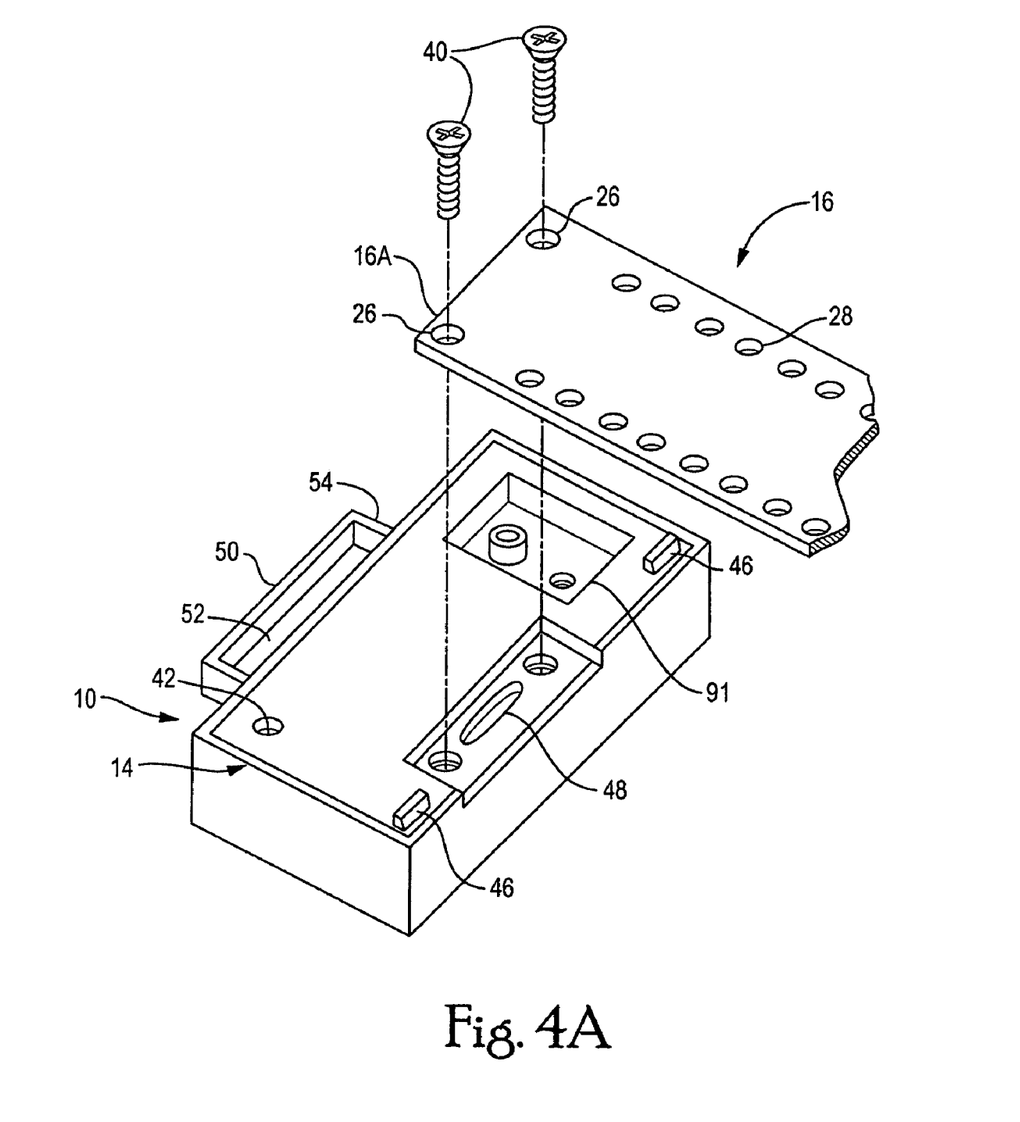
FIG. 4A is an exploded view showing the attachment of the strap to the housing of the device, according to an embodiment of the present invention.
Figure 4B:
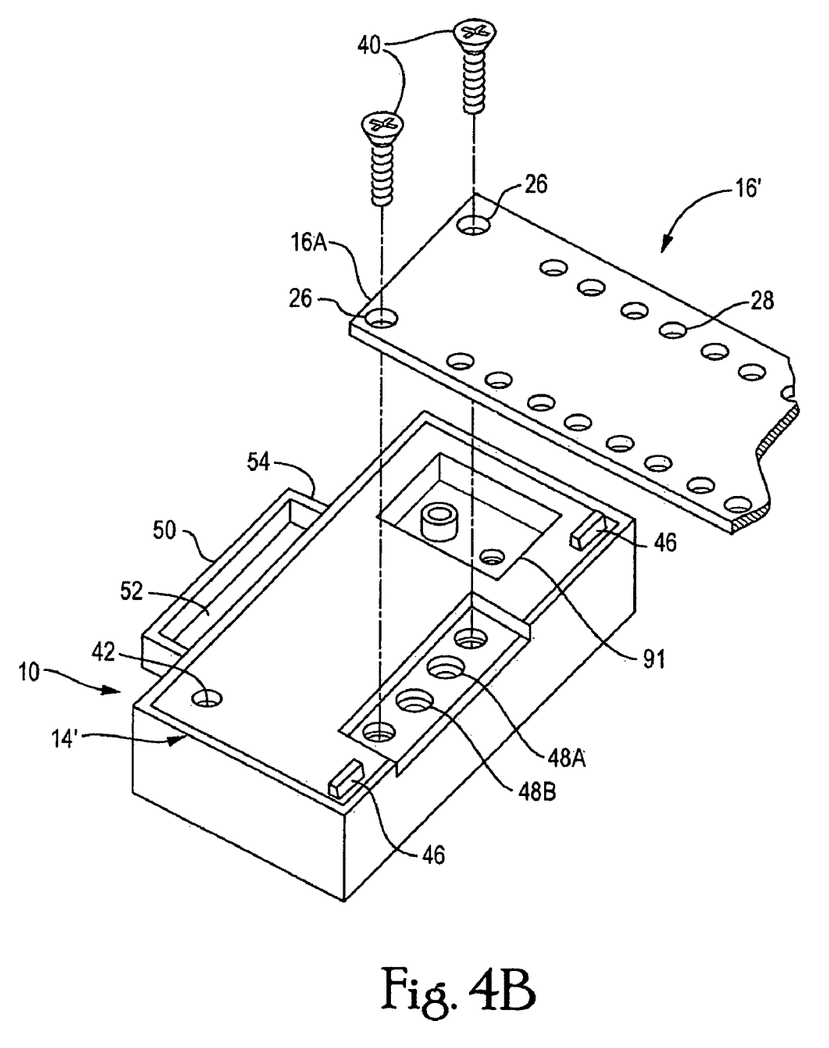
FIG. 4B is an exploded view showing the attachment of the strap to the housing of the device, according to another embodiment of the present invention.

FIG. 3 shows a see-through of the main housing 14, 14' and lock bracket 12 assembly, according to an embodiment of the present invention. The main housing 14, 14' contains battery 30, electrical connector 32, tamper sensor switch 34, and antenna 36. The end 16A of the strap 16, 16' is attached to the housing 14, 14' using fasteners 40 via apertures 26 (as shown in FIGS. 4A and 4B), as will be described in more detail in the following paragraphs.

The battery 30 can be any suitable rechargeable battery such as, but not limited to, a lithium ion battery. When the strap 16, 16' is not provided with a battery, the battery 30 can be a long life battery which can have a charge life of up to approximately 21 to 30 days when used for offender monitoring in monitoring units having current efficient circuitry and antenna design, and effective power management algorithms to minimize the number and duration of transmissions from the unit and the intensiveness of calculations carried out in the mobile unit. A charge life of approximately 21 to 30 days allows the offender to visit a probation officer only once a month for recharging the battery, if at all.

When used with a power strap, the battery provided in the strap 16, 16' can also have long life charge characteristics. In which case, the battery 30 within the housing 14, 14' can be used as a short term back-up power supply, for example to operate the device 10 temporarily if the power strap is damaged or disconnected. A storage in device 10 can be sufficient to store messages or data and GPS location recordings for two weeks or more depending upon the frequency with which GPS location readings are recorded.

The electrical connector 32 can be any suitable waterproof connector, i.e., a connector that resists seepage in water at a depth of up to 66 feet for a period of up to 8 hours. The female/male connector 32 connects with an opposite part (male/female) by either a snap-lock, threaded coupling, friction fit, or similar mechanisms. The electrical connector 32 is attached to a wall of the main housing 14, 14' using any appropriate waterproof adhesive such as, but not limited to, epoxy adhesive. The electrical connector 32 can be provided with two or more electrical connections. By attaching the connector to a wall of the main housing 14, 14' (e.g., wall of front housing part 14A of the main housing 14, 14') using an adhesive (e.g. epoxy adhesive) the interface between the electrical connector 32 and the wall of the housing 14, 14' is rendered water tight or waterproof as defined above. The electrical connector 32 can be used as a power connector to recharge the battery 30 disposed inside the main housing 12. The electrical connector 32 can also be used as a data connector to transfer data between the device 10 and another device or a computer. For example, a cable having a mating connector on one end and a different connector on the other end can be used to link the electrical connector 32 in the device 10 with a computer, such as by way of a USB connector, an RS-232 style: serial connector, or other types of connections to a computer.

Figure 8:
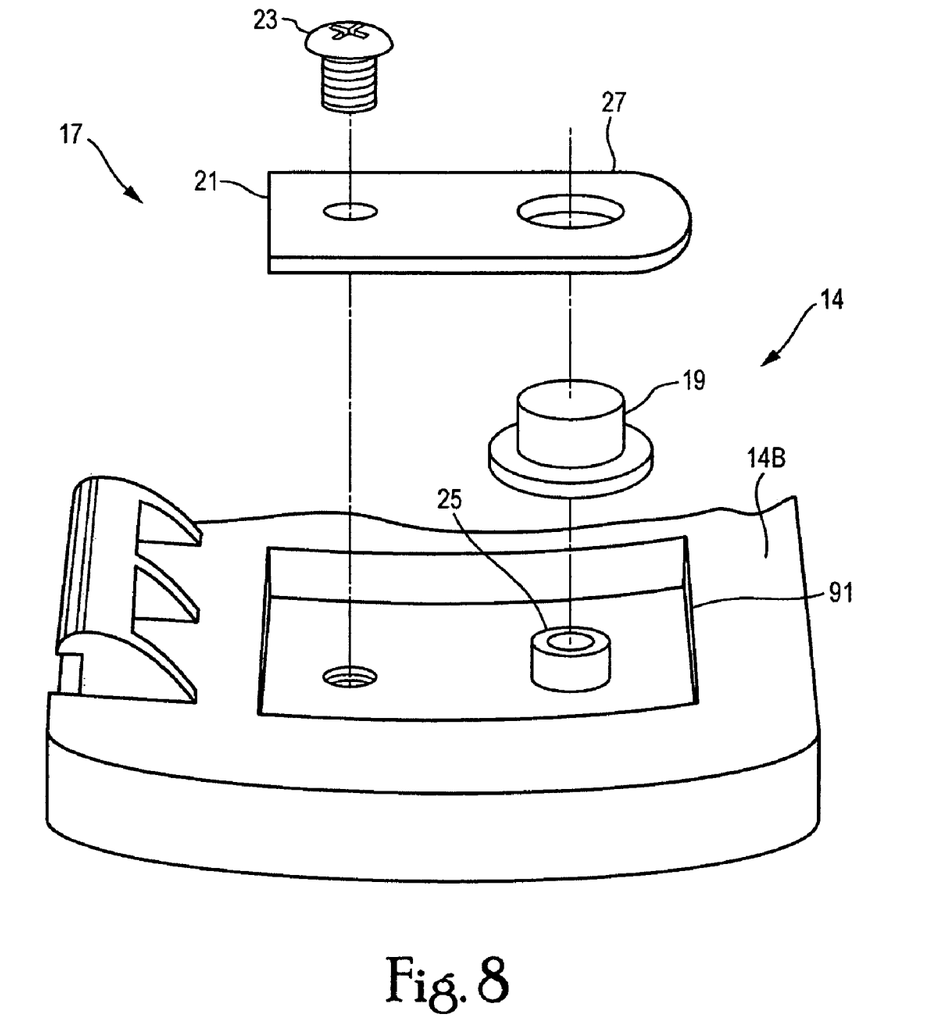
FIG. 8 is a perspective exploded view showing a valve assembly relative to the rest of the housing of the tracking device, according to an embodiment of the present invention.

The main housing 14, 14' also comprises a valve assembly 17. The valve assembly 17 can be provided in either the front housing part 14A or the plate-like part 14B. In one embodiment, the valve assembly 17 is provided in the plate-like part 14B, as shown in FIG. 8. FIG. 8 is a perspective exploded view showing the valve assembly 17 relative to the rest of the main housing 14, 14'. The valve assembly 17 includes a cap 19, a restraining part 21 and fastener 23. The cap 19 closes an opening or hole 25 provided in a recess 91 of the main housing 14, 14'. The restraining part 21 is used to press upon the cap 19 so as to hold the cap against the opening 25. The fastener 23 (e.g., a screw) is used to fasten the restraining part 21 to the plate-like part 14B so that the restraining part 21 presses against the cap 19. The opening 25 is provided in the main housing 14, 14' so that in case the battery 30 fails and explodes, gas pressure inside the cavity of the main housing 14, 14' can be released through the opening 25. In one embodiment, the restraining part 21 is designed with a breakable section 27. The breakable section 27 is thinner than any wall of the housing 14, 14'. For example, the breakable section 27 of the restraining part 21 can have a thickness of about 1/32 of an inch. In another embodiment, the restraining part 21 can be made rigid enough to hold the cap 19 but flexible enough to bend under a certain pressure or force exerted via cap 19. In case of battery explosion, when gas pressure inside the cavity of the housing 14, 14' exceeds a certain level, gases inside the cavity of the housing 14, 14' would push against the cap 19 to escape through the opening 25. The cap 19 would push against the breakable section 27 of the restraining part 21 which would snap, or alternatively, would push against the flexible retraining part 21 which would bend thus releasing the gases to atmosphere. In this way, instead of the pressure acting upon the walls of the housing 14, 14' which may result in more damages, the valve assembly 17 is provided so as to prevent the damages by releasing gas pressure into air via the valve assembly 17.

FIG. 4A shows an exploded view of the attachment of the strap 16 to the housing 14, according to an embodiment of the present invention. As shown in FIG. 4A, fasteners 40 are received through apertures 26 of strap 16 so as to fasten the end 16A of strap 16 to bottom of main housing 14. The bottom of main housing 14 has various features including a recess 42 for tamper sensor 34, rearward facing hooks 46 connecting the housing 14 to lock bracket 12, lens opening 48 to transmit light to and from internal optoelectronic devices such as a light emitting diode and a photodiode (not shown) to the light guide connector 24 of strap 16 (shown in FIG. 2), a recess 91 for receiving valve assembly 17 (shown in FIG. 8), and forward lip 50 defining cavity 52. The side walls for cavity 52 have apertures 54 to receive locking pins 60 and 61 (shown in FIG. 5).

FIG. 4B shows an exploded view of the attachment of the strap 16' to the housing 14', according to an embodiment of the present invention. As shown in FIG. 4B, fasteners 40 are received through apertures 26 of strap 16' so as to fasten the end 16A of strap 16' to bottom of main housing 14'. Similar to the embodiment shown in FIG. 4A, the bottom of main housing 14' has various features including a recess 42 for tamper sensor 34, rearward facing hooks 46 connecting the housing 14' to lock bracket 12, a recess 91 for receiving valve assembly 17 (shown in FIG. 8), and forward lip 56 defining cavity 52. The side walls for cavity 52 have apertures 54 to receive locking pins 60 and 61 (shown in FIG. 5). In addition, as shown in FIG. 4B, the bottom of main housing 14' further includes lens opening 48A configured to receive light guide connector 24A of strap 16' so that light can be transmitted from an internal optoelectronic device, such as a light-emitting diode, through the opening 48A to the light guide connector 24A of strap 16' (shown in FIG. 2B) and lens opening 48B configured to receive light guide connector 24B of strap 16' so that light can be transmitted Via the opening 48B to an internal light receiver such as a photodiode.

Figure 5:
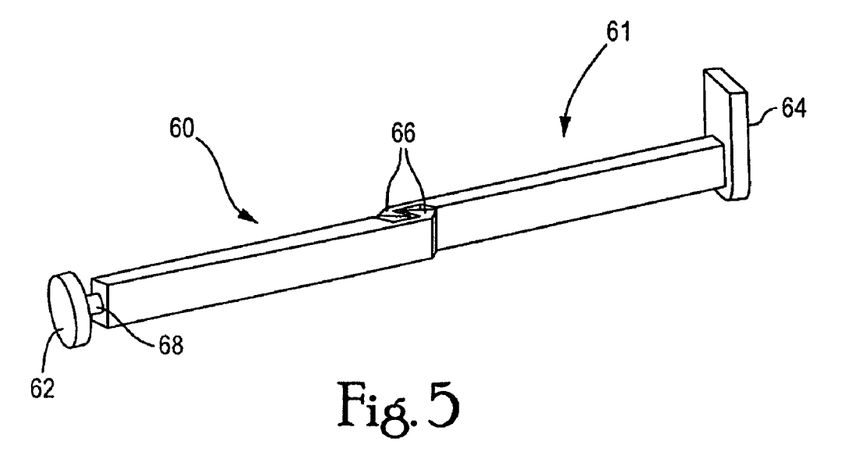
FIG. 5 is a perspective view of a locking pin utilized to attach the strap of FIG. 2A or 2B to the housing of the tracking device of FIG. 1, according to an embodiment of the present invention.

FIG. 5 shows the locking pins 60 and 61, according to an embodiment of the present invention. Locking pin 60 has pin head 62. Locking pin 61 has a base 64. The pin head 62 connects to an end of locking pin 60 through a neck or breakable portion 68. The locking pins 60 and 61 are adapted to lock the strap 16, 16' (shown in FIG. 1) between the housing 14, 14' (shown in FIG. 1) and the lock bracket (shown in FIG. 1). The ends of both locking pin 60 and locking pin 61 are formed with hooks 66 which, when properly inserted into apertures 54 (shown in FIGS. 4A and 4B) and lateral apertures 76 (shown in FIG. 6), interlock with one another, thereby preventing their removal without forcibly breaking portion 68.

Figure 6:
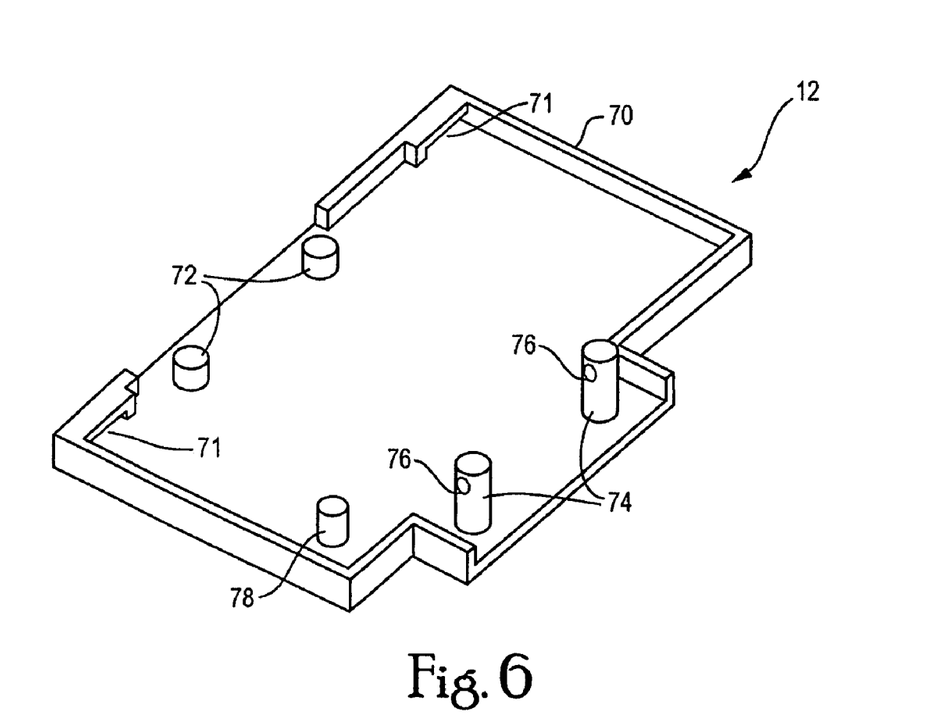
FIG. 6 is a perspective view of a lock bracket of the tracking device shown in FIG. 1, according to an embodiment of the present invention.

FIG. 6 shows the lock bracket 12 of the tracking device 10, according to an embodiment of the present invention. The lock bracket 12 has an outer flange 70 to receive the housing 14, 14'. The flange 70 is provided with flange recesses 71 for connecting with rearward facing hooks 46 (shown in FIGS. 4A and 4B) provided in the main housing 14, 14'. The lock bracket 12 has a plurality of upstanding pins 72, 74. At one end are two relatively short pins 72 that interface in the strap openings 28 (shown in FIGS. 2A and 2B). At the opposite side of the face of lock bracket 12 are two taller pins 74 that are received in apertures 28 of strap 16, 16' after it encircles the offender's arm or leg. These taller pins 74 have lateral apertures 76 to receive the locking pins 60 and 61 (shown in FIG. 5). Also shown is pin 78 that is received in a recess 42 (shown in FIGS. 4A and 4B) to activate the tamper sensor switch 34 (shown in FIG. 3).

Returning to FIG. 3, the tamper sensor switch 34 can be a magnetic field sensor that does not require any external electrical contacts. For example, one possible arrangement of the magnetic field sensor 34 is to position the electromagnetic field sensor so that pin 78 (shown in FIG. 6) which, in this example, is made from a magnetic material generates a magnetic field and activates the tamper sensor switch 34 (shown in FIG. 3) through the recess 42 (shown in FIGS. 4A and 4B) or generally through the plate-like part 14B of the housing 14, 14'. If the lock bracket 12 is moved, the magnetic pin 78, which generates a magnetic field, will also be moved relative to the magnetic field sensor 34. As a result, the magnetic field sensor 34 will sense a change in the magnetic field and this will trigger the magnetic field sensor 34 to generate a tamper alarm. Alternatively, the pin 78 need not be provided. In which case, the magnetic material can be provided, for example, on a surface of the lock bracket 12 or imbedded in the lock bracket 12. When the lock bracket 12 is moved, the magnetic sensor 34 will sense a change in the magnetic field and generate and tamper alarm. In another embodiment, the magnetic field sensor 34 can be configured to both generate a magnetic field and sense changes in the magnetic field. In yet another embodiment, a magnetic material can be provided inside the housing 14, 14' in the vicinity of the magnetic field sensor 34. In both of these cases, the pin can be made from a material, such as a material comprising iron, that alters the magnetic field (e.g., alters the intensity of the magnetic field or generally alters the lines of field of the magnetic field). When the pin 78 is close to the magnetic sensor 34 or close to the magnetic material inside the housing 14, 14', the magnetic sensor will sense an initial magnetic field. However, when the lock bracket 12 is moved, the pin 78 will also be moved relative to the magnetic field sensor 34 or relative to the magnetic material inside the housing 14, 14'. As a result, the magnetic field sensor 34 will sense a magnetic field different from the initial magnetic field and this will trigger the magnetic field sensor 34 to generate a tamper alarm.

A tamper detector to ascertain whether there has been a breach of the housing 14, 14' may include, for example, a light sensor provided inside the housing 14, 14' that is activated when light enters the housing 14, 14' and/or the magnetic field sensor 34 (shown in FIG. 3) that is activated if, for example, the magnetic pin 78 in lock bracket 12 (shown in FIG. 6) is moved relative to the housing 14, 14'.

Another tamper detector that can be used with the optical cable 20 (shown in FIGS. 2A and 2B) may utilize a light source (e.g., one or more Light Emitting Diodes or LEDs), a light source driver (e.g., a LED driver), and a light receiver. The light source can be configured to emit one or more different wavelengths of light in a desired (for example, alternating) sequence or random sequence through the lens opening 48 (shown in FIG. 4A) into the light guide connector 24 (shown in FIG. 2A) or through the lens opening 48A (shown in FIG. 4B) into the light guide connector 24A (shown in FIG. 2B). The light guide connector 24 directs the light, onto a first length of optical cable 20 (shown in FIG. 2A) to light guide 22 (shown in FIG. 2A). The light guide 22 (shown in FIG. 2A) redirects the light back on a second length of optical cable 20 to the light receiver. Alternatively, the light guide connector 24A directs the light onto the optical cable 20 (continuous optical cable shown in FIG. 2B), and the light is continuously guided through the optical cable 20 via, for example, a U-turn in the optical cable 20 to the light receiver. The light receiver can be selected to detect light having the frequency being emitted by the LED and/or detect a particular pattern of light pulses, and if the LED receiver fails to detect light at the selected frequency and/or receives the wrong pattern of light pulses, a tamper alert can be generated. As a result, the use of the light cable 20 provides an enhanced tamper security. Since optical techniques are employed, the device 10 can be used in an aquatic environment without any potential short circuit that may otherwise occur if an electrical wire is used instead of the optical cable.

It will be appreciated that in securing the device 10 to an offender, it is not necessary to resize strap 16, 16' as the strap can fit a substantial range of offender leg or arm sizes and requires no special tools to secure the unit on the offender's leg or arm. Thus, the strap 16, 16' does not need to be cut to be adjusted to a particular offender. Furthermore, when the device is removed from an offender, only the pin 60 is destroyed, so that the strap 16, 16' may be reused.

To fit the device 10 to the offender, lock bracket 12 is placed on the offender's leg or arm. The light guide connectors 24 or 24A, 24B (shown in FIGS. 2A and 2B) at end 16A of the strap 16, 16' are secured to the housing 14, 14' by using screws 40 (shown in FIGS. 4A and 4B). The strap 16, 16' is placed so that the unattached end is received over posts 72 and 74 (shown in FIGS. 1 and 6). The strap 16, 16' is then wrapped around the offender's leg or arm, and the main housing hooks 46 (shown in FIGS. 4A and 4B) are received in flange recesses 71 on lock bracket 12 (shown in FIG. 6), while posts 74 extend upward into cavity 52 (shown in FIGS. 4A and 4B). The locking pins 60, 61 (shown in FIG. 5) are then passed through apertures 54 and pin holes 76 (shown in FIG. 6) so that the pin head 62 (shown in FIG. 5) extends from one side of lip 50 and base 64 extends from the other side of lip 50. Hooks 66 on pins 60, 61 are locked together.

In the event that the offender should attempt to remove pin 60 and/or pin 61, it will break at breakpoint 68, the lock bracket 12 may move and the tamper sensor switch 34 (shown in FIG. 3) will be activated. Similarly, if the optical cable 20 in strap 16, 16' (shown in FIGS. 2A and 2B) is cut, the light receiver will detect an interruption of the light and an alarm be activated. If the main housing 14, 14' is moved from lock bracket 12, the tamper sensor switch 34 (shown in FIG. 3) will be activated. In any of these instances, the device 10 will send a message to authorities (e.g., police station, court, etc.) advising of the tampering event.

While various embodiments of the present, invention have been described above, it should be understood that they have been presented by way of example, and not limitation. It will be apparent to persons skilled in the relevant art(s) that, various changes in form and detail can be made therein without departing from the spirit and scope of the present invention. In fact, after reading the above description, it will be, apparent to one skilled in the relevant art(s) how to implement the invention in alternative embodiments. Thus, the present invention should not be limited by any of the above-described exemplary embodiments.

For example, the tracking device can be used without a strap for tracking an object. For example, this can be done by imbedding or otherwise attaching or disposing the tracking device in or on the object. The object can be a container such as a shipping container, a money bag, or any other object that requires tracking.

Moreover, the method and device of the present invention, like related devices and methods used in position monitoring or tracking arts are complex in nature, are often best practiced by empirically determining the appropriate values of the operating parameters, or by conducting computer simulations to arrive at best design for a given application. Accordingly, all suitable modifications, combinations and equivalents should be considered as falling within the spirit and scope of the invention.

In addition, it should be understood that the figures, are presented for example purposes only. The architecture of the present invention is sufficiently flexible and configurable, such that it may be utilized in ways other than that shown in the accompanying figures.

What is claimed is:

1. A tracking device for an individual or object, comprising:
   a housing configured to house components for tracking an individual or object, the housing having a first part and a second part, the first and second parts being configured to be joined together to form a waterproof housing, wherein the housing comprises a waterproof valve assembly configured to release gas pressure that may originate from a battery failure housed inside the housing,
   the valve assembly including a cap configured to close an opening provided in the housing to release gas pressure, a restraining part configured to hold the cap against the opening, and a fastener configured to fasten the restraining part to the housing so that the restraining part holds the cap.

2. The tracking device of claim 1, wherein the first part includes a housing part and the second part includes a plate-like part.

3. The tracking device of claim 1, wherein the first part and the second part are joined together by welding using an ultrasonic welding procedure.

4. The tracking device of claim 1, wherein the first part and the second part are joined together using an adhesive.

5. The tracking device of claim 4, wherein the adhesive is a radiation curing adhesive.

6. The tracking device of claim 1, wherein the components include a battery electronic circuitry, optical devices, or optical connectors, or any combination of two or more thereof.

7. The tracking device of claim 6, wherein the electronic circuitry includes a transceiver, an antenna, GPS locating circuitry, an electrical connector, or a tamper sensor, or any combination of two or more thereof.

8. The tracking device of claim 7, wherein the electronic circuitry includes the electrical connector, wherein the electrical connector is attached to a wall of the housing using an adhesive.

9. The tracking device of claim 8, wherein the adhesive is an epoxy adhesive.

10. The tracking device of claim 7, wherein the electronic circuitry includes the electrical connector, wherein the electrical connector includes terminals to charge or recharge the battery or to transfer data between the device and another device, or both.

11. The tracking device of claim 7, wherein the electronic circuitry includes the tamper sensor.

12. The tracking device of claim 11, further comprising a lock bracket configured to attach to the housing, the lock bracket comprising an element, Wherein the tamper sensor is arranged in the housing such that when the lock bracket is moved the tamper sensor is triggered to generate a tamper alarm.

13. The tracking device of claim 1, wherein the components include at least a battery and a data storage component.

14. The tracking device of claim 1, wherein the restraining part comprises a breakable section which is adapted to break when gas pressure pushes against the cap.

15. The tracking device of claim 1, wherein the restraining part is configured to be flexible so as to bend when gas pressure pushes against the cap.

16. The tracking device of claim 1, further comprising a lock bracket configured to attach to the housing, and a strap configured to hold the lock bracket around the individual.

17. The tracking device of claim 16, wherein the strap comprises a light guide connector, a light guide and an optical cable, wherein the light guide connector is disposed at a first end of the strap and is configured to direct light through a first length of the optical cable to the light guide disposed at a second end of the strap opposite to the first end of the strap, and the light guide is configured to redirect the light back through a second length of the optical cable to the first end of the strap.

18. The tracking device of claim 17, further comprising a light source configured to emit light into the light guide connector and a light receiver configured to receive light from the optical cable.

19. The tracking device of claim 18, wherein the light source is configured to emit in one or more wavelengths and the light receiver is configured to detect the one or more wavelengths.

20. The tracking device of claim 17, wherein the optical cable is embedded inside the strap.

21. The tracking device of claim 17, wherein the strap is made from a plastic material.

22. The tracking device of claim 16, wherein the housing and/or the lock bracket include at least one pin and the strap includes a plurality of holes at least one of which engages the at least one pin to enable adjustment around the individual.

23. The tracking device of claim 22, wherein the strap is configured and arranged to be reused on different individuals.

24. The tracking device of claim 22, wherein the strap is configured and arranged to enable the adjustment to occur without cutting the strap.

25. The tracking device of claim 16, further comprising a first locking pin and a second locking pin adapted to lock the strap between the housing and the lock bracket.

26. The tracking device of claim 25, wherein the first locking pin comprises a pin head and a hook section, the second locking pin comprises a base and a hook section, the hook section of the first locking pin and the hook section of the second locking pin being configured to interlock with one another when inserted into the lock bracket.

27. The tracking device of claim 16, wherein the strap comprises a light guide connector and a continuous optical cable, the light guide connector being configured to direct light into and receive light from the continuous optical cable and the continuous optical cable being configured to guide light through the strap continuously from one end of the optical cable to another end of the optical cable.

28. The tracking device of claim 27, wherein the light guide connector comprises a first light guide connector configured to direct light into the optical cable and a second light guide connector configured to receive light from the optical cable.

29. The tracking device of claim 28, further comprising a light source configured to emit light into the optical cable through the first light connector and a light receiver configured to receive light from the optical cable via the second light guide connector.

30. The tracking device of claim 29, wherein the light source is configured to emit in one or more wavelengths and the light receiver is configured to detect the one or more wavelengths.

31. The tracking device of claim 27, wherein the continuous optical cable is embedded inside the strap.

32. The tracking device of claim 1, wherein the housing is disposed in or on an object.

33. The tracking device of claim 32, wherein the object is a container.

34. The tracking device of claim 33, wherein the container is a money bag.

* * * * *